United States Patent
Bernstein et al.

(10) Patent No.: US 6,452,391 B1
(45) Date of Patent: Sep. 17, 2002

(54) QUIET MODE MAGNETIC RESONANCE IMAGING SYSTEM AND METHOD

(75) Inventors: Tsur Bernstein, Glendale; Mark K. Limkeman, New Berlin, both of WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/330,585

(22) Filed: Jun. 11, 1999

(51) Int. Cl.[7] ................................................. G01V 3/00
(52) U.S. Cl. ........................ 324/309; 324/307; 324/312
(58) Field of Search ................................. 324/309, 307, 324/320, 322, 318, 312

(56) References Cited

U.S. PATENT DOCUMENTS

| | | | |
|---|---|---|---|
| 4,680,545 A | 7/1987 | Gray et al. | 324/307 |
| 4,954,781 A | 9/1990 | Hirata | 324/318 |
| 4,995,394 A * | 2/1991 | Cline et al. | 324/309 |
| 5,235,283 A | 8/1993 | Lehne et al. | 324/318 |
| 5,617,026 A | 4/1997 | Yoshino et al. | 324/318 |
| 5,661,399 A | 8/1997 | Sellers | 324/318 |
| 5,793,210 A | 8/1998 | Pla et al. | 324/318 |

\* cited by examiner

*Primary Examiner*—Edward Lefkowitz
*Assistant Examiner*—D. Vargas
(74) *Attorney, Agent, or Firm*—Fletcher, Yoder & Van Someren (57) ABSTRACT

An MRI system is provided with normal and quiet modes of operation. The quiet mode may be selected from an operator station, such as via a graphical user interface. When the quiet mode of operation is selected, configuration parameters are used for the particular pulse sequence to be executed in the examination. The configuration parameters for the quiet mode of operation may be derived from those of the normal mode of operation. The quiet mode of operation may, for example, employ gradient pulses having reduced amplitudes and slew rates as compared to those employed in the normal mode of operation. The reduced amplitudes and slew rates, along with changes in timing of the pulses and between pulses of the pulse sequence of the examination result in reduced acoustic noise for accommodating more sensitive patients.

23 Claims, 4 Drawing Sheets

QUIET MODE MAGNETIC RESONANCE IMAGING SYSTEM AND METHOD

FIELD OF THE INVENTION

The present invention relates generally to magnetic resonance imaging systems, such as those used in medical diagnostics. More particularly, the invention relates to a technique for reducing acoustic noise in magnetic resonance imaging systems.

BACKGROUND OF THE INVENTION

Over the last decades, magnetic resonance imaging (MRI) systems have found widespread use, particularly in medical diagnostics applications. MRI systems make use of the physical influence of magnetic fields on gyromagnetic material within a subject to be imaged. In general, by imposing external magnetic fields on the subject, nuclei having characteristic precession frequencies can be made to orient themselves and to spin in known ways, to produce detectable signals.

In current MRI systems, the particular magnetic fields imposed on the subject can be manipulated so as to produce high-quality, reliable images for use in medical diagnostics. In conventional MRI systems, for example, gradient fields are produced which define a desired slice through the subject, and which encode the positions of the materials of interest through the selected slice in accordance with their location. The gradient fields are produced in the presence of a primary magnetic field, generally oriented longitudinally with respect to the subject. After imposition of a radio frequency pulse which produces a transverse moment in the gyromagnetic material, echo signals from the material can be sensed and processed to identify the intensity of the response at the various locations in the slice. After such data processing, an image can be reconstructed based upon the acquired and processed data.

Numerous improvements have been made in recent years, both to MRI imaging systems and to the techniques employed to produce resulting images. Many of these techniques permit reductions in image artifacts by virtue of novel pulse sequences implemented through gradient and RF coil structures. Improvements in the physical structures of MRI systems have also improved image quality and reduced the occurrence of artifacts. In many cases, the physical system improvements have worked in conjunction with software enhancements to enable much faster and higher quality imaging. Examination sequences which required minutes and seconds in the past may now be performed in a fraction of that time.

Although MRI systems have improved dramatically, they remain plagued by certain characteristic problems. A particular problem in the systems is the acoustic noise generated by application of the pulse sequences to the coil structures needed to produce the desired images. As improved coil structures and pulse sequences have been improved to obtain the benefits discussed above, the resulting acoustic noise has often become exacerbated due, for example, to higher currents and higher slew rates, and the rapidity of execution of pulse sequences. While many attempts have been made to locate sources of acoustic noise, and to reduce the noise, such as through changing the characteristic frequencies and amplitudes of vibration of mechanical components, and so forth, acoustic noise remains a serious problem in many systems. While the examination durations are often shorter through the use of new pulse sequences and processing techniques, many patients still find MRI examinations discomforting due to the acoustic noise associated with the examination sequences.

There is a need, at present, for techniques capable of reducing acoustic noise of MRI systems, at least for certain examination sequences or certain patients. There is a particular need for a simple and straightforward technique for selectively reducing acoustic noise in state-of-the-art MRI systems which does not impair the improved functionality of the systems for most pulse sequences, but which accommodates the needs of more sensitive patients. Moreover, there is a need for a technique which does not require extensive reconfiguration of the system by an operator when a sensitive patient is present.

SUMMARY OF THE INVENTION

The present invention provides a technique for reducing acoustic noise in MRI systems designed to respond to these needs. The technique may be implemented in a wide variety of MRI systems, including existing and new systems of any type or manufacture. The technique may also be applied with any type of pulse sequence, and is particularly well suited to pulse sequences apt to generate significant acoustic noise. The technique may be used in parallel with existing, conventional MRI control circuitry, to permit pulse sequences to be implemented for examinations on a normal basis, and to permit quieter sequences to be implemented when needed.

The reduced noise mode of operation may call upon a set of configuration parameters which is different from the normal mode parameters for the same pulse sequences. Alternatively, the quiet mode pulse sequences may be derived from the normal mode pulse sequences, such as through imposition of gradient amplitude limits, slew rate limits, coefficients or multipliers to rescale parameters, and so forth. The quiet mode of operation may be a distinct, "on-off" selection which is made by toggling a switch, presented, for example, as a virtual button in a graphical user interface at an operator station. Alternatively, the quiet mode of operation may provide an adjustable range of settings varying from the normal mode, such that the operator may adjust the acoustic noise indirectly through the use of a virtual slide in a graphical user interface. Other types of interface may, of course, be employed. In either case, the quiet mode of operation results in reduced acoustical noise by modification of the pulse sequence for the desired examination. The resulting images may be similar to those of the normal mode images, but require slightly longer acquisition times. In general, however, image quality may be balanced against comfort of the patient, where needed, to provide the best available image for individual patients, depending upon their sensibilities.

DETAILED DESCRIPTION OF THE INVENTION

Figure 1:
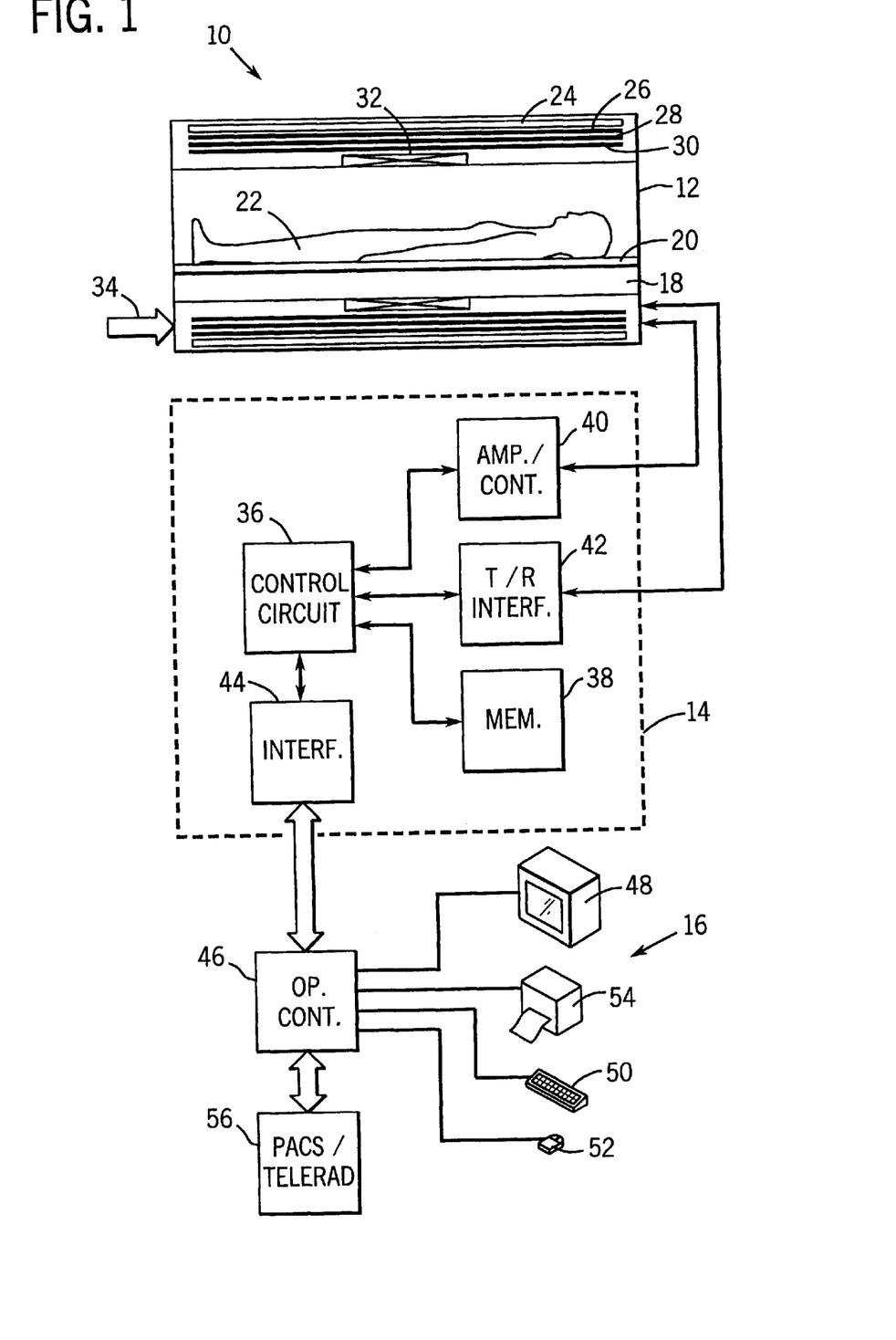
FIG. 1 is a diagrammatical representation of an MRI system for use in medical diagnostic imaging and implementing certain aspects of the present invention.

Turning now to the drawings, and referring first to FIG. 1, a magnetic resonance imaging (MRI) system 10 is illustrated diagramatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radio frequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. A radio frequency coil 32 is provided for generating radio frequency pulses for exciting the gyromagnetic material. In the embodiment illustrated in FIG. 1, coil 32 also serves as a receiving coil. Thus, RF coil 32 may be coupled with driving and receiving circuitry in passive and active modes for receiving emissions from the gyromagnetic material and for outputting radio frequency excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

The coils of scanner 12 are controlled by external circuitry to generate desired fields and pulses, and to read emissions from the gyromagnetic material in a controlled manner. As will be appreciated by those skilled in the art, when the material, typically bound in tissues of the patient, is subjected to the primary field, individual magnetic moments of the paramagnetic nuclei in the tissue attempt to aligned with the field but precess in a random order at their characteristic or Larmor frequency. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. Radio signals are emitted following the termination of the excitation signals. This magnetic resonance signal is detected in the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a linear variation in the overall magnetic field strength across the field of view. Combinations of such fields, orthogonally disposed with respect to one another, enable the creation of a linear gradient in any direction by vector addition of the individual gradient fields.

The gradient fields may be considered to be oriented both in physical planes, as well as by logical axes. In the physical sense, the fields are mutually orthogonally oriented to form a coordinate system which can be rotated by appropriate manipulation of the pulsed current applied to the individual field coils. In a logical sense, the coordinate system defines gradients which are typically referred to as slice select gradients, frequency encoding gradients, and phase encoding gradients.

The slice select gradient determines a slab of tissue or anatomy to be imaged in the patient. The slice select gradient field may thus be applied simultaneous with a selective RF pulse to excite a known volume of spins within a desired slice that precess at the same frequency. The slice thickness is determined by the bandwidth of the RF pulse and the gradient strength across the field of view.

A second logical gradient axis, the frequency encoding gradient axis is also known as the readout gradient axis, and is applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position across the gradient field. By Fourier transformation, acquired signals may be analyzed to identify their location in the selected slice by virtue of the frequency encoding.

Finally, the phase encode gradient is generally applied in a sequence before the readout gradient and after the slice select gradient. Localization of spins in the gyromagnetic material in the phase encode direction is accomplished by sequentially inducing variations in phase of the precessing protons of the material by using slightly different gradient amplitudes that are sequentially applied during the data acquisition sequence. Phase variations are thus linearly imposed across the field of view, and spatial position within the slice is encoded by the polarity and the degree of phase difference accumulated relative to a null position. The phase encode gradient permits phase differences to be created among the spins of the material in accordance with their position in the phase encode direction.

As will be appreciated by those skilled in the art, a great number of variations may be devised for pulse sequences employing the logical axes described above. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radio frequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to emit the radio frequency excitation pulses and to receive MR signals, circuitry 42 will typically include a switching device for toggling the RF coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a cylindrical bore imaging system employing a superconducting primary field magnet assembly, the present technique may be applied to various other configurations, such as scanners employing vertical fields with permanent magnets and electromagnets.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, tel-eradiology systems, and the like.

It has been found that in structures of scanners such as those of MRI system 10 illustrated in FIG. 1, significant acoustic noise may be generated during particular examination sequences. While the origin of such acoustic noise, the characteristics of the noise, such as frequency, rhythm, volume, and so forth, may have a number of origins, the particular adjustments which may be made in the pulse sequences are difficult to identify to reduce or attenuate the acoustic noise. However, regardless of the source, many patients and clinicians find the noise levels, and particularly the pulsation of noise levels which accompany many MRI examination sequences uncomfortable and disconcerting. The present technique has been developed, therefore, to provide for both normal operation and a quiet mode of operation wherein adjustments may be made to the pulse sequences implemented in the system to reduce the level of acoustic noise.

Figure 2:
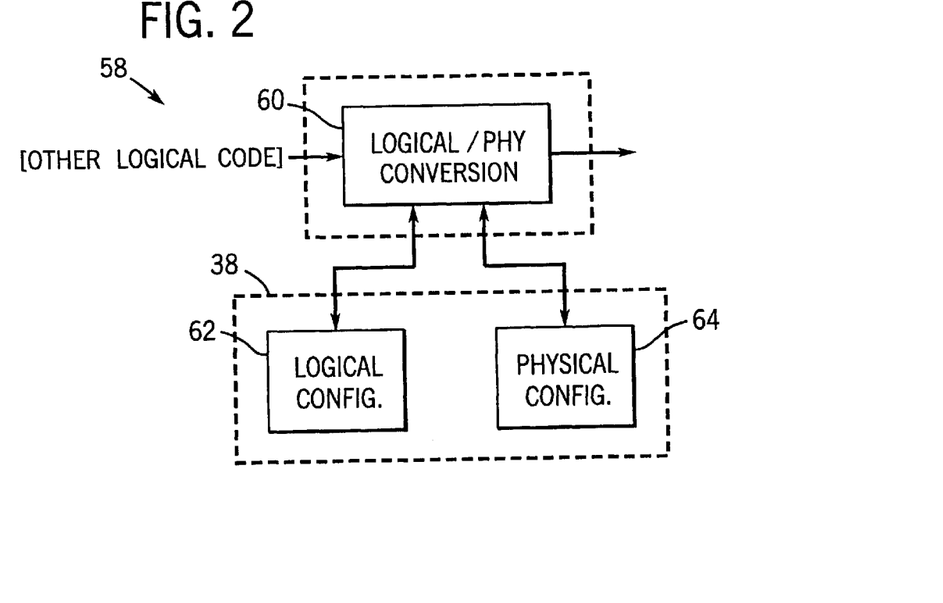
FIG. 2 is a block diagram of functional components of a pulse sequence description module in a controller for a system of the type illustrated in FIG. 1.

As described more fully below, the quiet mode of operation of system 10 is implemented through adjustments in the pulse sequences applied to the coils of the system. In general, these pulse sequences will be defined by both logical and physical configuration sets and parameter settings stored within control circuitry 14. FIG. 2 represents, diagrammatically, relationships between functional components of control circuit 36 and configuration components stored with memory circuitry 38. The functional components facilitate coordination of the pulse sequences to accommodate preestablished settings for both logical and physical axes of the system. In general, the axis control modules, denoted collectively by reference numeral 58, include a logical-to-physical module 60 which is typically implemented via software routines executed by control circuit 36. In particular, the conversion module is implemented through control routines which define particular pulse sequences in accordance with preestablished imaging protocols.

When called upon, code defining the conversion module references logical configuration sets 62 and physical configuration sets 64. The logical configuration sets may include parameters such as pulse amplitudes, beginning times, time delays, and so forth, for the various logical axes described above. The physical configuration sets, on the other hand, will typically include parameters related to the physical constraints of the scanner itself, including maximum and minimum allowable currents, switching times, amplification, scaling, and so forth. Conversion module 60 serves to generate the pulse sequence for driving the coils of scanner 12 in accordance with constraints defined in these configuration sets. The conversion module will also serve to define adapted pulses for each physical axis to properly orient (e.g. rotate) slices and to encode gyromagnetic material in accordance with desired rotation or reorientations of the physical axes of the image.

Figure 3:
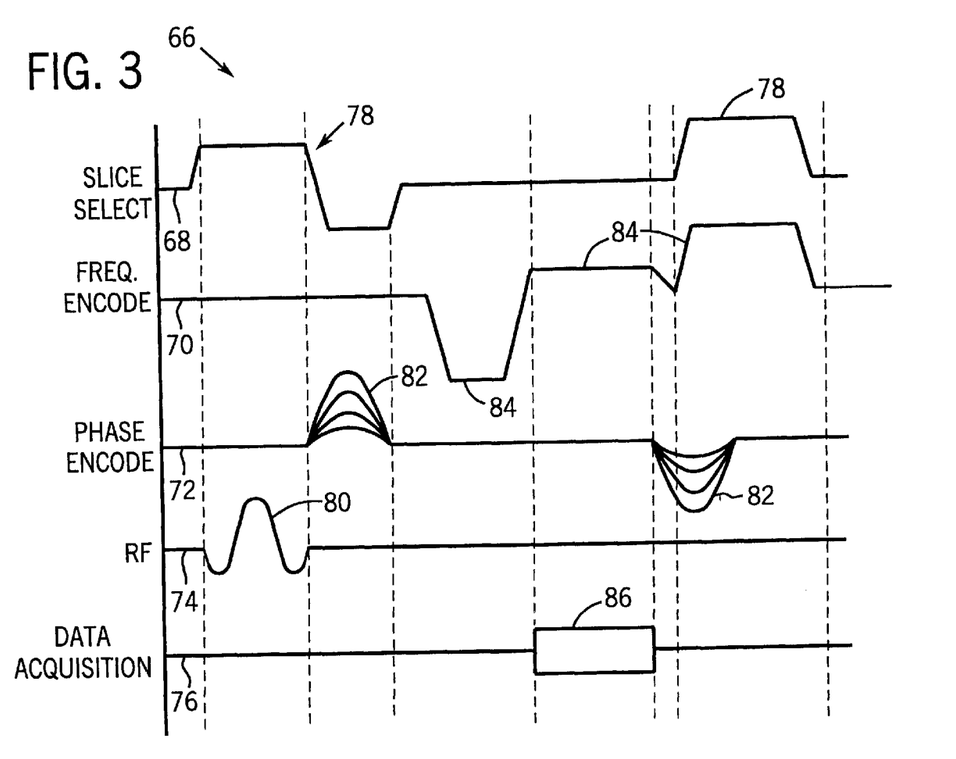
FIG. 3 is a graphical representation of an exemplary pulse sequence description for an MRI examination which may be implemented in the system of FIG. 1.

By way of example, FIG. 3 illustrates a typical pulse sequence which may be implemented on a system such as that illustrated in FIG. 1 and calling upon configuration and conversion components such as those shown in FIG. 2. While many different pulse sequence definitions may be implemented, depending upon the examination type, in the example of FIG. 3, a gradient recalled acquisition in steady state mode (GRASS) pulse sequence is defined by a series of pulses and gradients appropriately timed with respect to one another. The pulse sequence, indicated generally by reference numeral 66, is thus defined by pulses on a logical slice select axis 68, a frequency encoding axis 70, a phase encoding axis 72, an RF axis 74, and a data acquisition axis 76. In general, the pulse sequence description begins with a pair of gradient pulses on slice select axis 68 as represented at reference numeral 78. During a first of these gradient pulses, an RF pulse 80 is generated to excite gyromagnetic material in the subject. Phase encoding pulses 82 are then generated, followed by a frequency encoding gradient 84. A data acquisition window 86 provides for sensing signals resulting from the excitation pulses which are phase and frequency encoded. The pulse sequence description terminates with additional gradient pulses on the slice select, frequency encoding, and phase encoding axes.

Figure 4:
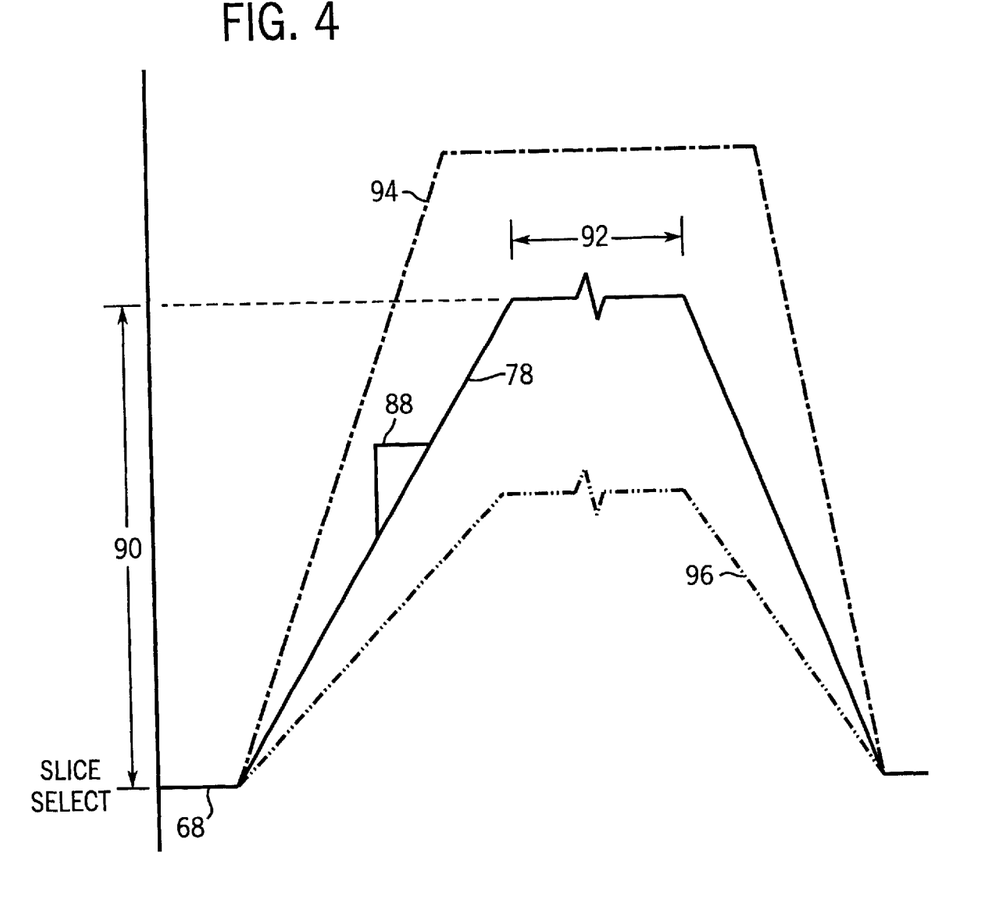
FIG. 4 is a detailed view of one of the gradient pulses of the sequence of FIG. 3, illustrating exemplary parameters which may be controlled for the quiet mode operation in accordance with certain aspects of the present invention.

Depending upon the orientation of the desired slice, and the strength of the fields desired, the logical configuration parameters of pulse sequence 66 may vary to provide faster or slower onset of the gradients, greater or lesser gradient amplitudes, various timings between the gradients, and so forth. Moreover, these logical configurations will be limited by physical configurations of the scanner and associated electronics. FIG. 4 represents several of the parameters which are controllable to define the pulse sequence.

As shown in FIG. 4, pulses applied to the gradient field coils of the scanner, such as on slice select axis 68, may be defined by several physical parameters. First, the pulses will typically rise to a desired amplitude 90 at a known or desired slew rate as denoted at reference numeral 88. The slew rate may be controlled in various manners to optimize the time, resolution, or other factors in the examination sequence. In many pulse sequence descriptions, however, the desired amplitude is often set to be obtained in the least time delay possible. As will be appreciated by those skilled in the art, the effective profile of the pulses may also be affected by such factors as uncompensated eddy currents, electronic nonlinearities, and so forth. In addition to the amplitude and slew rate, the pulses are typically characterized by a duration as represented at reference numeral 92. The timing between subsequent pulses in the examination sequence may also be controlled to provide the desired image data. It should be noted that the length or duration of the pulses such as those illustrated in FIG. 4 are selected for specific pulse sequences, typically in combination with the pulse amplitude, so as to provide a desired integral or area under the pulse curve, and hence a desired effect on the imaged slice.

As illustrated in FIG. 4, for various reasons, such as contrast, weighting, and so forth, the actual profile of the individual gradients, such as gradient 78, may typically be less aggressive than the physical constraints of the system would permit. For example, the electronic circuitry and coil configuration may actually permit a slew rate which is steeper than that employed in the pulse sequence, and a maximum amplitude which is greater than that created, as represented by broken line 94 in FIG. 4. It has been found that the acoustic noise resulting from MRI examination sequences may be significantly influenced by such factors as the slew rate, pulse amplitude, and so forth. Thus, in the present technique, the quiet mode of operation provides for adjusting pulse sequence parameters to provide adapted or modified pulse profiles such as represented by broken line 96 in FIG. 4. Again, it should be noted that the length or duration of the modified pulse may also be changed, typically as a function of the reduced amplitude, to provide a desired area under the pulse curve.

Figure 5:
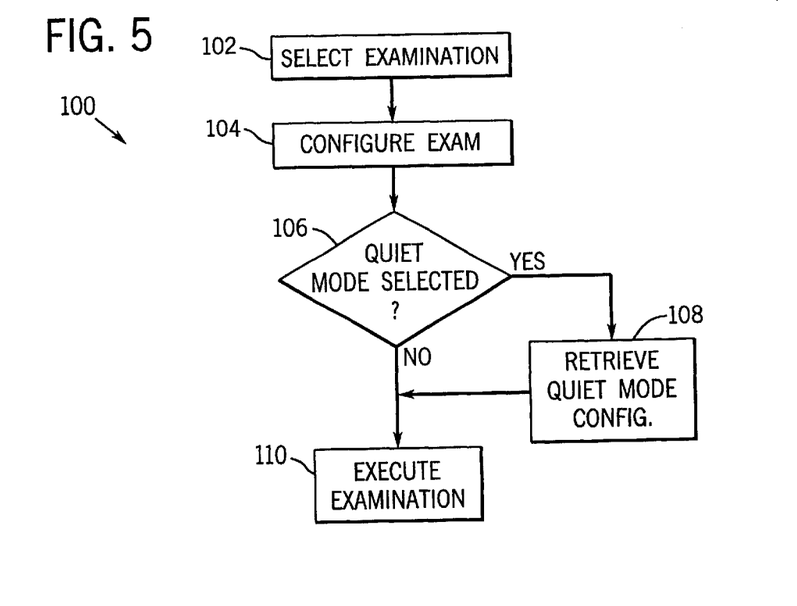
FIG. 5 is a block diagram illustrating exemplary control logic for quiet mode operation of an MRI system; and, FIG. 6 is a block diagram illustrating exemplary control logic of an alternative scheme for quiet mode operation.
Figure 6:
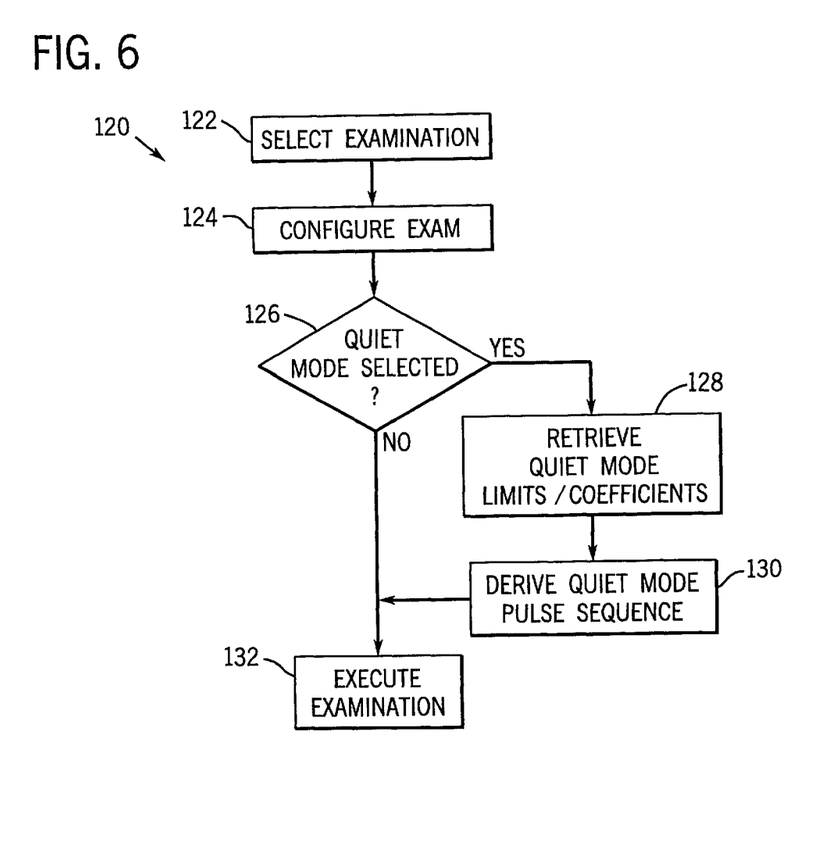

Several logical approaches may be adopted for implementation of the quiet mode operation of the present technique. In a preferred arrangement, however, the quiet mode is selectable by the operator in addition to at least one normal mode of operation. That is, through the interface components of the operator station described above with reference to FIG. 1, an operator may select the quiet mode of operation in addition to other commands input in the examination initialization. FIGS. 5 and 6 represent exemplary steps in control logic for processing the axis configurations when such quiet mode selections are made. It should be noted that, as mentioned above, the quiet mode of operation may be either an "on-off" type selection, or may provide for variable adjustment by the operator. That is, the operator may simply select a reduced acoustic noise configuration by toggling a virtual selection button on a graphical user interface, or by any other suitable input means. Alternatively, the acoustic noise may be adjusted in a variable manner by a "slide" type input, such as a virtual sliding button on a graphical user interface. In the latter case, adjustments to the pulse sequence, as described below, may be made progressively to reduce the level of acoustic noise to acceptable levels for the patient and operator.

As shown in FIG. 5, in a first embodiment, the control logic, denoted by reference numeral 100, begins with selection of an examination at step 102. The examination selection is typically made through the interface devices of the operator station discussed above with reference to FIG. 1. As part of this examination configuration, the user may select a quiet mode, such as via a screen-depicted selection box in a graphical user interface. At step 106, control circuit 36 determines whether the quiet mode has been selected and, if so, proceeds to step 108 to receive quiet mode configuration parameters. Again, the quiet mode may be an "on-off" selection or an adjustable selection.

The quiet mode configuration parameters for reducing acoustic noise in the MRI system will be stored in one or more memory devices as depicted at reference numeral 38 in FIG. 1. In general, the configuration sets will be comparable to those stored for normal operation, including specifications of slew rates, amplitudes, pulse durations, and so forth. The configuration parameters are used in identifying the particular pulses and their characteristics for the specific examination sequence as defined by the protocol selected at step 102. As will be appreciated by those skilled in the art, by appropriate selection of reduced amplitudes, for example, the configuration for a pulse duration may be extended to provide a desired integral of the gradient pulse. Slew rates for quiet mode operation may be less aggressive than those used in normal operation, that is, permit a longer duration for attaining the desired amplitude of the gradient, and a longer duration for declining from the steady state amplitude to the zero gradient level. It has been found that by reducing the power and slew rate of the gradient pulses, acoustic noise in the MRI system may be significantly reduced. While such reduction in power and adjustments to pulse timing may result in somewhat reduced resolution and a somewhat increased susceptibility to patient and tissue movement, the quiet mode operation permits particularly sensitive patients to be accommodated where needed.

The quiet mode configuration parameters retrieved in the procedure summarized in FIG. 5 may include both logical axis limitations or values as well as physical axis limitations or values. In general, the parameters may include scaled-back levels as compared to those employed in normal examination sequences. In the embodiment of FIG. 5, the configuration parameters constitute values in look-up tables which are stored in the system memory for retrieval upon selection of the quiet mode of operation. Where adjustable levels are available to the operator, several sets of configuration parameters may be stored and accessed in accordance with the operator selection, or parameters may be computed as described below. Once these parameters are retrieved, they are employed and definition of the pulse sequence, and the resulting examination is executed at step 110.

FIG. 6 represents an alternative procedure for implementing a quiet mode of operation. In this procedure, summarized by reference numeral 120 in FIG. 6, the examination is selected at step 122 as in the foregoing example. At step 124 the examination is configured, by accessing a corresponding protocol and pulse sequence description model stored in the system memory. The configuration at step 124, again, may include operator selection of a quiet mode of operation. At step 126, if the quiet mode of operation is selected, control advances to step 128 where quiet mode limits and coefficients are accessed from the system memory. Where the quiet mode selection includes adjustable levels, the operator-selected level is encoded and the corresponding signal is read at step 128. In the exemplary embodiment of FIG. 6, rather than fixed configuration parameters, the quiet mode parameter levels are derived from normal operating parameters, such as through the use of fixed limits and scaling factors. These scaling factors may include percentages which may be preestablished or set by an operator, such as for determining quiet mode slew rates, gradient amplitudes, and so forth. Again, these levels may be fixed or adjustable. Gradient durations may be then derived from the resulting scaled parameters to provide the desired slice selection, phase encoding, and frequency encoding. The quiet mode pulse sequence is thus derived at step 130 from the scaling factors and coefficients accessed at step 128 applied to the normal pulse descriptions for the selected examination routine. Once the pulse sequence has been derived, the examination is then executed as indicated at step 132.

As will be appreciated by those skilled in the art, various modifications and adaptation may be made to the quiet mode technique discussed herein. For example, two or more such quiet modes may be provided, each corresponding to particular configuration parameters or scaling factors used in converting the model pulse sequence description to the quiet mode pulse sequence description. Moreover, specific settings for the quiet mode slew rates and amplitudes may be set following minimal experimentation on particular systems, system types, and system physical configurations. The particular values set for each system or system type, as well as for particular pulse sequence descriptions or examination types, may then be set so as to balance any reduction in image quality with a corresponding improvement in acoustic noise levels.

What is claimed is:

1. A method for controlling a magnetic resonance imaging system, the system including a scanner having a primary field coil, a plurality of gradient coils for generating controlled gradient fields, at least one radio frequency coil for generating excitation pulses, and a receiving circuit for receiving resulting magnetic resonance signals, the method comprising the steps of:

defining an examination pulse sequence for generating image data via control of the gradient coils and the radio frequency coil;

selecting a normal mode or an acoustically quiet mode of operation;

modifying the examination pulse sequence based upon the selected mode of operation; and executing the pulse sequence in accordance with the selected mode of operation.

2. The method of claim 1, wherein the pulse sequence is modified by reduction of a slew rate of at least one gradient pulse.

3. The method of claim 1, wherein the pulse sequence is modified by reduction of an amplitude of at least one gradient pulse.

4. The method of claim 1, wherein configuration parameters for the quiet mode of operation are derived from parameters for the normal mode of operation.

5. The method of claim 1, wherein configuration parameters for the normal mode and quiet mode are stored in a memory circuit of a controller coupled to the scanner.

6. The method of claim 1, wherein the pulse sequence is modified by setting at least one configuration parameter defining a constraint for logical or physical axes of the scanner to a level different from a level set for the normal mode of operation.

7. The method of claim 1, wherein the quiet mode selection is an on-off selection.

8. The method of claim 1, wherein the quiet mode selection includes a user-variable adjustment from the normal mode.

9. A method for reducing acoustic noise in a magnetic resonance imaging system including a plurality of gradient coils and a radio frequency coil, the gradient coils and the radio frequency coils being coupled to a controller for providing control signals for implementing predetermined pulse signals via the gradient and radio frequency coils, the method comprising the steps of:

storing configuration parameters for an examination pulse sequence definition, the parameters defining an acoustically quiet mode of operation and a normal mode of operation;

accessing this examination pulse sequence definition;

accessing the quiet mode parameters in response to selection of a quiet mode command by an operator; and executing the examination pulse sequence based upon the definition and the quiet mode parameters.

10. The method of claim 9, wherein configuration parameters for the quiet mode of operation are derived from configuration parameters for the normal mode of operation.

11. The method of claim 9, wherein the configuration parameters for the quiet mode of operation include a gradient slew rate lower than a corresponding slew rate for the normal mode of operation.

12. The method of claim 9, wherein the configuration parameters for the quiet mode of operation include a gradient amplitude lower than a corresponding gradient amplitude for the normal mode of operation.

13. The method of claim 9, wherein the quiet mode parameters are stored in a memory circuit associated with the controller.

14. The method of claim 9, wherein the quiet mode parameters are based on logical or physical axis constraints for the scanner coils.

15. A method for reducing acoustic noise in a magnetic resonance imaging system including a scanner having gradient coils, a radio frequency coil and receiving coil, a memory circuit for storing examination pulse sequence definitions and configuration parameters, and control circuitry for commanding execution of the pulse sequences in the scanner, the method comprising the steps of:

storing configuration parameters for an acoustically quiet mode of operation of the system in the memory circuit, quiet mode configuration parameters including gradient pulse slew rates and amplitudes reduced from corresponding slew rates and amplitudes of a normal mode of operation; and executing an examination pulse sequence based upon a stored definition and the quiet mode parameters upon selection of the quiet mode of operation.

16. The method of claim 15, wherein at least one of the quiet mode parameters is derived from a configuration parameter for a normal mode of operation.

17. The method of claim 15, wherein the quiet mode parameter is derived from the normal mode parameter by multiplying the normal mode parameter by a scaling coefficient.

18. The method of claim 15, comprising the further steps of selecting the quiet mode of operation via an operator interface.

19. A magnetic resonance imaging system comprising:

a scanner having a plurality of gradient coils for generating controlled magnetic field gradients, a radio frequency coil for generating excitation signals, and a receiver coil for detecting resulting magnetic resonance signals;

a memory circuit for storing pulse sequence definitions and configuration parameters, including parameters for a normal mode of operation and an acoustically quiet mode of operation; and a scanner controller for commanding execution of pulse sequences in the scanner based upon the pulse sequence definitions and the normal mode or quiet mode parameters.

20. The system of claim 19, further comprising an operator interface for selecting the normal mode of operation or the quiet mode of operation, the operator interface being coupled to the scanner controller for communicating signals corresponding to the selected mode for execution in the scanner.

21. The system of claim 19, wherein quiet mode parameters are derived from normal mode parameters.

22. The system of claim 19, wherein the quiet mode parameters include slew rates for gradient pulses lower than corresponding slew rates for the normal mode of operation.

23. The system of claim 19, wherein the quiet mode parameters include gradient pulse amplitudes lower than corresponding amplitudes for the normal mode of operation.

* * * * *